US009142393B2

(12) United States Patent
Okabe et al.

(10) Patent No.: US 9,142,393 B2
(45) Date of Patent: Sep. 22, 2015

(54) METHOD FOR CLEANING REACTION CHAMBER USING PRE-CLEANING PROCESS

(71) Applicant: ASM IP Holding B.V., Almere (NL)

(72) Inventors: Tatsuhiro Okabe, Sagamahira (JP); Atsuki Fukazawa, Tama (JP)

(73) Assignee: ASM IP Holding B.V., Almere (NL)

( * ) Notice: Subject to any disclaimer, the term of this patent is extended or adjusted under 35 U.S.C. 154(b) by 142 days.

(21) Appl. No.: 13/901,372

(22) Filed: May 23, 2013

(65) Prior Publication Data

US 2014/0345644 A1     Nov. 27, 2014

(51) Int. Cl.
| | |
|---|---|
| *B08B 7/00* | (2006.01) |
| *H01J 37/32* | (2006.01) |
| *C23C 16/44* | (2006.01) |
| *B08B 9/00* | (2006.01) |
| *B08B 9/027* | (2006.01) |
| *B08B 5/00* | (2006.01) |

(52) U.S. Cl.
CPC ....... *H01J 37/32862* (2013.01); *C23C 16/4405* (2013.01); *H01J 37/32091* (2013.01); *B08B 5/00* (2013.01); *B08B 7/00* (2013.01); *B08B 7/0035* (2013.01); *B08B 9/00* (2013.01); *B08B 9/027* (2013.01)

(58) Field of Classification Search
CPC ........... C23G 16/4405; C23G 16/4401; B08B 7/0035; B08B 5/00; B08B 9/00; B08B 7/00; H01J 37/32862
USPC ........... 118/715; 438/905; 134/1, 1.1, 2, 22.1, 134/22.12, 26, 30, 36, 42
See application file for complete search history.

(56) References Cited

U.S. PATENT DOCUMENTS

| | | | | |
|---|---|---|---|---|
| 5,356,478 | A | * | 10/1994 | Chen et al. ......................... 134/1 |
| 5,679,215 | A | * | 10/1997 | Barnes et al. ................... 134/1.1 |
| 6,187,691 | B1 | | 2/2001 | Fukuda |
| 6,271,148 | B1 | | 8/2001 | Kao |
| 6,329,297 | B1 | | 12/2001 | Balish |
| 6,347,636 | B1 | | 2/2002 | Xia |
| 6,352,945 | B1 | | 3/2002 | Matsuki |
| 6,374,831 | B1 | | 4/2002 | Chandran |
| 6,383,955 | B1 | | 5/2002 | Matsuki |
| 6,387,207 | B1 | | 5/2002 | Janakiraman |
| 7,234,476 | B2 | | 6/2007 | Arai |
| 8,591,659 | B1 | * | 11/2013 | Fang et al. ...................... 134/1.1 |
| 2002/0011210 | A1 | | 1/2002 | Satoh |
| 2004/0013818 | A1 | * | 1/2004 | Moon et al. .................... 427/576 |
| 2004/0103914 | A1 | * | 6/2004 | Cheng et al. ................... 134/1.1 |
| 2006/0016783 | A1 | * | 1/2006 | Wu et al. .......................... 216/58 |
| 2006/0191555 | A1 | * | 8/2006 | Yoshida et al. ................ 134/1.1 |
| 2007/0186952 | A1 | * | 8/2007 | Honda et al. ................... 134/1.1 |

(Continued)

*Primary Examiner* — Bibi Carrillo
(74) *Attorney, Agent, or Firm* — Snell & Wilmer LLP

(57) ABSTRACT

A method for cleaning a reaction chamber is conducted after depositing an oxide, nitride, or oxynitride film on a substrate in a reaction chamber having interior surfaces on which oxide, nitride, or oxynitride is accumulated as a result of the deposition, said oxide, nitride, or oxynitride being selected from the group consisting of silicon oxide, silicon nitride, silicon oxynitride, metal oxide, metal nitride, and metal oxynitride. The method includes: oxidizing or nitriding the oxide, nitride, or oxynitride is accumulated on the interior surfaces of the reaction chamber, by RF-excited plasma of an oxygen- or nitrogen-containing gas in the absence of halide gas as a pre-cleaning step; and cleaning the interior surfaces of the reaction chamber, by RF-excited plasma of a halide cleaning gas.

15 Claims, 2 Drawing Sheets

(56) References Cited

U.S. PATENT DOCUMENTS

| | | | |
|---|---|---|---|
| 2007/0207275 A1* | 9/2007 | Nowak et al. | 427/569 |
| 2007/0248767 A1 | 10/2007 | Okura | |
| 2008/0173326 A1* | 7/2008 | Gu et al. | 134/1.1 |
| 2009/0090382 A1 | 4/2009 | Morisada | |
| 2009/0246399 A1 | 10/2009 | Goundar | |
| 2013/0048606 A1* | 2/2013 | Mao et al. | 216/67 |

* cited by examiner

METHOD FOR CLEANING REACTION CHAMBER USING PRE-CLEANING PROCESS

BACKGROUND OF THE INVENTION

1. Field of the Invention

The present invention generally relates to a method of cleaning a reaction chamber, particularly cleaning silicon- or metal-oxide, nitride, or oxynitride deposits from the reaction chamber.

2. Description of the Related Art

In a single-substrate processing apparatus, while depositing a silicon- or metal-oxide or nitride film on a substrate, a film is not only formed on the substrate but also on inner surfaces of a reaction chamber. Unwanted film on the inner surfaces produces particles which deposit on the substrate during film deposition processing which as a result deteriorate the quality of the film on the substrate. Thus, the reaction chamber is cleaned periodically by using an in-situ cleaning process. Accumulation of adhesive products on surfaces of electrodes may affect plasma generation or distribution over a substrate and may cause damage to the electrodes. The materials deposited in these areas can affect the deposition rate from substrate to substrate and the uniformity of the deposition on the substrate.

Several methods for cleaning reaction chambers have been developed. For example; when unwanted titanium deposits are built up on the interior surfaces of a reaction chamber, cleaning is conducted using a chlorine gas in combination with temperature control (U.S. Pat. No. 5,983,906). Also, for cleaning an HDP-CVD processing chamber, two-step cleaning is conducted using fluorine-containing gas (U.S. Pat. No. 7,588,036).

However, the above conventional methods using a halide cleaning gas are not effective in cleaning metal oxide or metal nitride, and it is difficult to reduce generation of particles and to reduce a metal contamination level in a film deposited on a substrate after the cleaning.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

In some embodiments, before cleaning a reaction chamber, the interior surfaces of the reaction chamber is subjected to plasma oxidization/nitridation as a pre-cleaning step. Merely as an example, the reaction chamber is used for Si and/or metal processing. By conducting the pre-cleaning step, unwanted accumulated deposits formed on the interior surfaces of the reaction chamber are oxidized or nitrided, thereby dissociating carbons from the deposits, which carbons interfere with cleaning with a halide cleaning gas, thereby increasing efficiency of the cleaning step.

Sonic embodiments provide a method for cleaning a reaction chamber after depositing an oxide, nitride, or oxynitride film on a substrate in a reaction chamber having interior surfaces on which oxide, nitride, or oxynitride is accumulated as a result of the deposition, said oxide, nitride, or oxynitride being selected from the group consisting of silicon oxide, silicon nitride, silicon oxynitride, metal oxide, metal nitride, and metal oxynitride, wherein the method comprises: (i) oxidizing or nitriding the oxide, nitride, or oxynitride accumulated on the interior surfaces of the reaction chamber, by RF-excited plasma of an oxygen- or nitrogen-containing gas in the absence of halide gas as a pre-cleaning step; and (ii) cleaning the interior surfaces of the reaction chamber, by RF-excited plasma of a halide cleaning gas.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
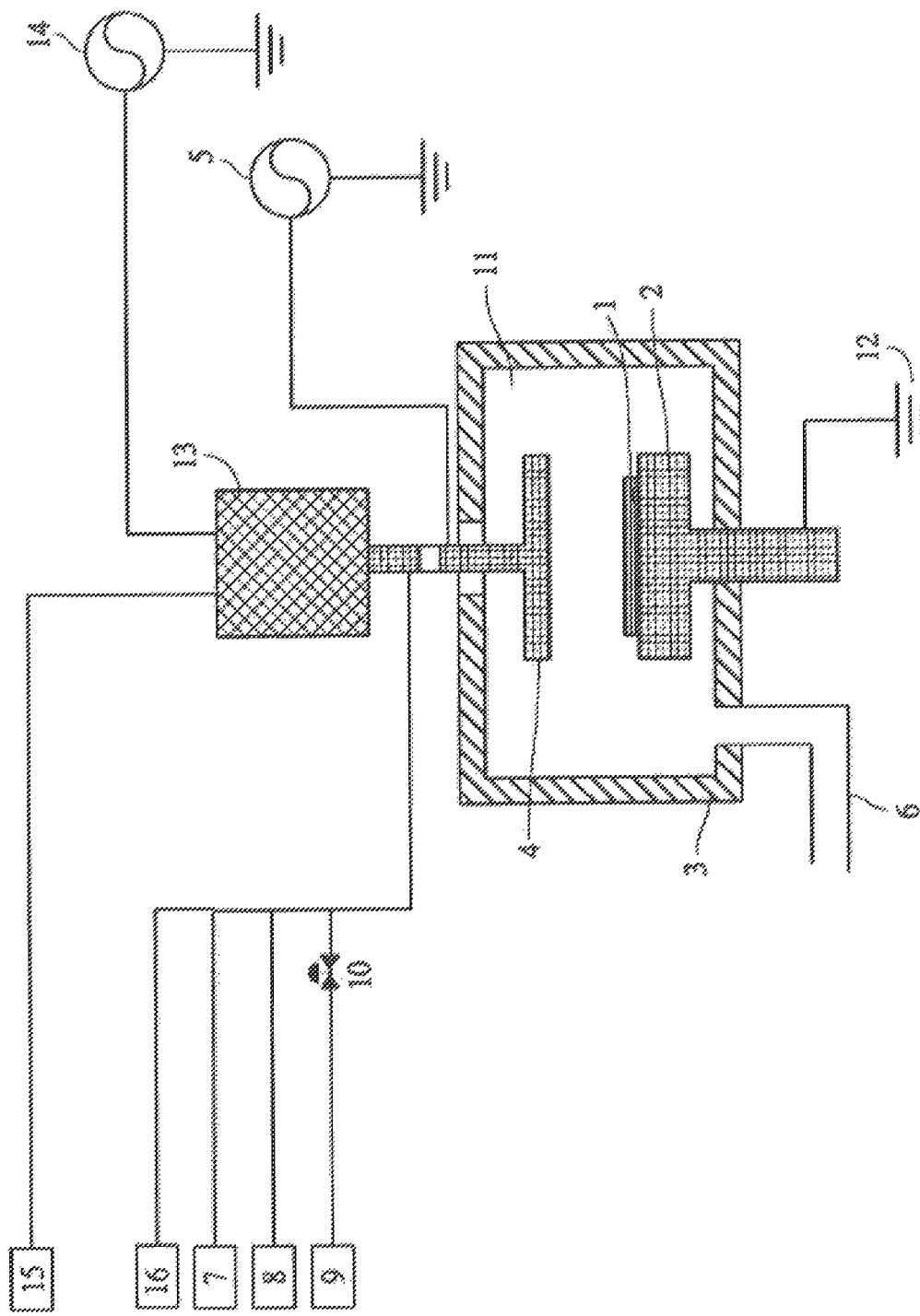
FIG. 1 is a schematic view showing an example of an atomic layer deposition (ALD) apparatus provided with a remote plasma unit, which can be used in an embodiment of the present invention.

In this disclosure, "gas" may include vaporized solid and/or liquid and may be constituted by a single gas or a mixture of gases. Likewise, an article "a" or "an" refers to a species or a genus including multiple species. In this disclosure, a gas introduced to a reaction chamber through a showerhead for pre-cleaning may be comprised of, consist essentially of or consist of a pre-cleaning gas for oxidizing and/or nitriding unwanted deposits when RF power is applied to the gas, and an additive gas which is not an oxidizing and/or nitriding gas. The "pre-cleaning" refers to a process prior to cleaning, rather than an initial process of cleaning. The pre-cleaning gas and the additive gas can be introduced as a mixed gas or separately to a reaction chamber. The pre-cleaning gas can be introduced with a carrier gas such as a rare gas. A gas other than the pre-cleaning gas, i.e., a gas introduced without passing through the showerhead, may be used for, e.g., sealing a reaction space, which includes a seal gas such as a rare gas. Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc, in some embodiments.

In the present disclosure where conditions and/or structures are not specified. A skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

As described above, in some embodiments, provided is a method for cleaning a reaction chamber after depositing an oxide, nitride, or oxynitride film on a substrate in a reaction chamber having interior surfaces on which oxide, nitride, or oxynitride is accumulated as a result of the deposition, said oxide, nitride, or oxynitride being selected from the group consisting of silicon oxide, silicon nitride, silicon oxynitride, metal oxide, metal nitride, and metal oxynitride, wherein the method comprises: (i) oxidizing or nitriding the oxide, nitride, or oxynitride accumulated on the interior surfaces of the reaction chamber ("unwanted deposits"), by RP-excited plasma of an oxygen- or nitrogen-containing gas in the absence of halide gas as a pre-cleaning step; and then (ii) cleaning the interior surfaces of the reaction chamber, by RF-excited plasma of a halide cleaning gas. The interior surfaces of the reaction chamber to be cleaned includes surfaces of a showerhead, a susceptor, and inner walls surrounding the reaction space.

The unwanted deposits are constituted typically or mainly by compositions composing a film formed on a substrate by a deposition step. If the film is a nitride, the unwanted deposits may further comprise oxide or oxynitride since oxidization can easily occur during the deposition step. Merely as an example, if the film is a TiN film, the unwanted deposits may be constituted by TiN, TiO, TiCxHy, TiNCxHy, TiOCxHy, CxHy (x and y are integers), etc., wherein Ti may become a metal contaminant. Merely as an example, if the film is a TiO film, the unwanted deposits may be constituted by no, TiCxHy, TiOCxHy, CxHy (x and y are integers), etc., wherein Ti may become a metal contaminant. In the above, the carbon-containing elements such as TiOCxHy, TiNCxHy, etc, interfere with cleaning with a halide cleaning gas, thereby incompletely removing the unwanted deposits on the interior surfaces of the reaction chamber. Merely as an example, by oxidizing the oxygen-carbon-containing elements, the oxygen-carbon-containing elements can be converted to an oxide by the pre-cleaning step, which oxide can be removed by a halide cleaning gas by the cleaning step as illustrated below.

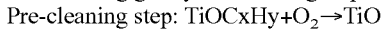
Pre-cleaning step: TiOCxHy+O$_2$→TiO

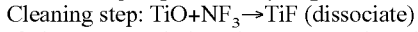
Cleaning step: TiO+NF$_3$→TiF (dissociate)

If the unwanted deposits are constituted by a nitride, merely as an example, by nitriding the nitorogen-carbon-containing elements, the nitrogen-carbon-containing elements can be converted to a nitride by the pre-cleaning step, which nitride can be removed by a halide cleaning gas by the cleaning step as illustrated below.

Pre-cleaning step: TiNCxHy+N$_2$→TiN

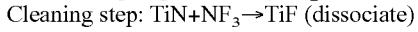
Cleaning step: TiN+NF$_3$→TiF (dissociate)

If the unwanted deposits are constituted by an oxynitride, they may be treated in a manner similar to deposits constituted by an oxide since oxidization more easily occurs than nitridation.

In some embodiments, the pre-cleaning step is conducted for a time period such that the above reactions are complete, e.g., for about 0.5 minutes to about 30 minutes, depending on, like other control variables, the pre-cleaning temperature, the thickness of unwanted deposits, the compositions of unwanted deposits, etc. In some embodiments, the pre-cleaning step is conducted for a time period which is shorter than (e.g., about 8% to about 90%, typically about 50% to about 80%, of) a time period during which the cleaning is conducted. The end point of the pre-cleaning step can be determined based on visual observation of the interior of the reaction chamber. In some embodiments, the pre-cleaning step does not substantially remove or is not capable of substantially removing unwanted deposits from the interior surfaces of the reaction chamber, regardless of the duration of the pre-cleaning step, and thus, it can be clearly distinguished from the cleaning step.

In some embodiments, the pre-cleaning step is suitable for cleaning an atomic layer deposition (ALD) chamber, since the pre-cleaning step is effective when a thickness of unwanted deposits to be removed is relatively thin (e.g., about 1 nm to about 20 nm, particularly about 1 nm to about 10 nm). The pre-cleaning step can be applied to a CVD chamber if a thickness of unwanted deposits is not high.

In some embodiments, the oxide, nitride, or oxynitride is silicon nitride or metal nitride and is nitrided in the pre-cleaning step by RF-excited plasma of a nitrogen-containing gas without an oxygen-containing gas. In some embodiments, the oxide, nitride, or oxynitride is selected from the group consisting of silicon oxide, silicon oxynitride, metal oxide, and metal oxynitride, and is oxidized in the pre-cleaning step by RF-excited plasma of an oxygen-containing gas.

In some embodiments, the RF-excited plasma in the pre-cleaning step is generated by applying RF power (e.g., 1 to 60 MHz, typically 13.56 MHz, about 0.07 W/cm$^2$ to about 7.1 W/cm$^2$—as measured per area of a substrate (about 50 W to about 5,000 W)) to the oxygen- or nitrogen-containing gas in the reaction chamber. In some embodiments, low frequency RF power (e.g., 400 kHz to 1 MHz) can be combined with the above RF (high-frequency RF) power at a ratio of, e.g., about $1/10$ to about $1/2$ of the high-frequency RF power. Alternatively, in some embodiments, the RF-excited plasma in the cleaning step is generated by a remote plasma unit and supplied to the reaction chamber.

In some embodiments, the deposited film is a metal oxide, metal nitride, or metal oxynitride film. Merely as an example, the metal is a transition metal such as Ti, Ta, W, or Ru. Merely as an example, the transition metal is Ti.

In some embodiments, the oxygen- or nitrogen-containing gas used in the pre-cleaning step is at least one gas selected from the group consisting of N$_2$, NH$_3$, O$_2$, O$_3$, CO$_2$, and N$_2$O. N$_2$ or NH$_3$ may be used for nitridation, whereas O$_2$, O$_3$, CO$_2$, and N$_2$O may be used for oxidization. In some embodiments, the oxygen- or nitrogen-containing gas used in the pre-cleaning step further comprises H$_2$, Ar, and/or He.

In some embodiments, the pre-cleaning step is conducted at a temperature between a temperature at which the deposition step is conducted and a temperature at which the cleaning step is conducted. Merely as an example, the temperature of the pre-cleaning step is about 50° C. to about 500° C. In some embodiments, the temperature of the pre cleaning step is set to be the same as the temperature of the cleaning step. When the temperature of the pre-cleaning step is as high as the temperature of the cleaning step, oxidization/nitridation can most effectively progress for the cleaning, although the temperature of the pre-cleaning step can be set independently of the temperature of the cleaning step (it can be lower or higher than the temperature of the cleaning step). In some embodiments, the temperature of the cleaning step is higher than that of the deposition step, and thus, the pre-cleaning step can begin by supplying the pre-cleaning gas in an excited state while the temperature is rising from the temperature of the deposition step to the set temperature of the pre-cleaning step.

Merely as an example, the pre-cleaning step can be conducted under the conditions shown in Table 1.

TABLE 1

| Pre-cleaning step | |
|---|---|
| Pressure [Pa] | 100 to 1000; typically 200 to 700 |
| Tem. [° C.] | 50 to 500; typically 70 to 400 (e.g., 300 to 400) |
| Pre-cleaning gas | $N_2$, $NH_3$, $O_2$, $O_3$, $CO_2$, $N_2O$ |
| Gas flow [sccm] | 50 to 5000; typically 500 to 2000 |
| Other gas | $H_2$, Ar, He |
| Gas flow [sccm] | 100 to 5000, typically 500 to 2000 |
| RF power [W] | 50 to 1000; typically 100 to 400 |
| RF frequency | 13.56 MHz |
| Duration [min] | 0.5 to 30; typically 1 to 10 |

In some embodiments, for the pre-cleaning step, remote plasma can be used alternatively or in combination with the in-situ plasma.

After the pre-cleaning step, the cleaning step begins. In some embodiments, the cleaning step is continuously conducted after the pre-cleaning step. In the above, "continuously" refers to without breaking a vacuum of the reaction chamber, without interruption as a timeline, without changing at least some treatment conditions (e.g., the conditions other than those for the active gases), immediately thereafter, or as a next step in some embodiments.

In some embodiments, the cleaning gas is a halide gas and contains no oxygen- or nitrogen-containing gas. In some embodiments, the cleaning step can be conducted according to any suitable methods including any conventional methods. For example, the following references disclose chamber cleaning technologies. U.S. Pat. No. 6,187,691, U.S. Pat. No. 6,374,831, U.S. Pat. No. 6,387,207, U.S. Pat. No. 6,329,297, U.S. Pat. No. 6,271,148, U.S. Pat. No. 6,347,636, U.S. Pat. No. 6,187,691, U.S. Patent Publication No. 2002/0011210A, U.S. Patent Publication No. 2002/0011210A, U.S. Pat. No. 6,352,945, and U.S. Pat. No. 6,383,955. The disclosure of the foregoing references is herein incorporated by reference in their entirety, especially with respect to general cleaning conditions.

Merely as an example, the cleaning step can be conducted under the conditions shown in Table 2.

TABLE 2

| Cleaning | |
|---|---|
| Pressure [Pa] | 100 to 1000; typically 200 to 700 |
| Tem. [° C.] | 50 to 500; typically 70 to 400 (e.g., 300 to 400) |
| Preprocess gas | $NF_3$ |
| Gas flow [sccm] | 500 to 7000; typically 500 to 5000 |
| Other gas | Ar, He |
| Gas flow [sccm] | 100 to 5000; typically 500 to 2000 |
| RF power [W] | Remote Plasma |
| Duration [min] | 1 to 120; typically 3 to 20 |

The embodiments will be explained with respect to preferred embodiments. However, the present invention is not limited to the preferred embodiments.

FIG. 1 is a schematic view of an apparatus combining a plasma-assisted ALD reactor and a remote plasma unit, desirably in conjunction with controls programmed to conduct the sequences described in this disclosure, which can be used in the embodiments. An apparatus which can be used in the present invention is not limited to an example shown in FIG. 1. A skilled artisan will appreciate that the apparatus includes one or more controller(s) (not shown) programmed or otherwise configured to cause the deposition and reactor cleaning processes described elsewhere herein to be conducted. The controller(s) will be communicated with the various power sources, heating systems, pumps, robotics and gas flow controllers or valves of the reactor, as will be appreciated by the skilled artisan.

In this example, by providing a pair of electrically conductive flat-plate electrodes 4, 2 in parallel and facing each other inside a reaction chamber 11, applying power from an RF power source 5 to one side, and electrically leading the other side to ground 12, plasma is excited between the electrodes. A temperature regulator is provided in a lower stage 2, and a temperature is kept constantly at a given temperature in the range of 0° C.-650° C. to regulate a temperature of a substrate 1 placed thereon. An upper electrode 4 serves as a shower plate as well, and reaction gas is introduced into the reaction chamber 11 through the shower plate. Additionally, in the reaction chamber 11, an exhaust pipe 6 is provided through which gas inside the reaction chamber 11 is exhausted.

A vaporizer (not shown) can vaporize a liquid precursor upstream of a precursor flow-controller. In the embodiment shown in FIG. 1, an inert gas is introduced from an inert gas source in communication with an inert gas flow-controller 8; a precursor is introduced from a precursor source in communication with the precursor flow-controller 9; and a reactant is introduced from a reactant source in communication with a reactant flow controller 7. A pulse flow control valve 10 is provided to generate pulse trains of the precursor. Additionally, in the reaction chamber 3, an exhaust pipe 6 is provided, through which gas in the interior 11 of the reaction chamber 3 is exhausted. Additionally, the embodiment shown in FIG. 1 is designed to be able to introduce an oxygen- or nitrogen-containing gas for the pre-cleaning step from a gas source in communication with a gas flow-controller 16 into the reaction chamber. The number of gas flow-controllers is not limited to the above, but can be provided appropriately to meet the number of gas types used. Cyclic CVD can be performed using the same apparatus as above in some embodiments.

The apparatus shown in FIG. 1 is provided with a remote plasma gas source in communication with a remote plasma unit 13 to which given gas species are supplied a given flow rate from a gas flow mass control unit 15. RF power is applied to the remote plasma unit from a remote plasma power source 14, thereby igniting plasma and generating plasma for cleaning. Generated plasma and radicals are introduced to the interior 11 of the reaction chamber via an upper part, thereby conducting cleaning of the reactor. In an embodiment, more than one gas flow mass control unit 15 can be used and suitably arranged depending on the type of gas, etc. Alternatively, the remote plasma unit 13 can be disposed on a side of the reactor. Further, the remote plasma unit 13 need not be disposed at an upper part of the reactor but can be disposed at various locations.

Using an apparatus such as the above, the deposition step (e.g., by plasma-enhanced ALD), the pre-cleaning step (by e.g., in-situ plasma) and the cleaning step (e.g., by remote plasma) can be performed as continuous processes. A skilled artisan in the art can readily perform the above steps in view of the present disclosure, as a matter of routine experimentation.

EXAMPLES

Deposition conditions: Deposition conditions in the examples are as follows: A plasma-enhanced ALT) apparatus shown in FIG. 1 was used as a reactor to deposit a TiN film on a substrate under the conditions shown in Table 3 below.

TABLE 3

| Deposition step | |
|---|---|
| Pressure [Pa] | 400 |
| Tem. [° C.] | 100 |
| Precursor | TDMAT |
| Gas flow [sccm] | Carrier Ar 2000, Precursor 0.01 |
| Supply time [sec] | 1.0 |
| Reactant | $H_2, N_2$ |
| Gas flow [sccm] | 500 (continuous) |
| Rare gas | Ar |
| Gas flow [sccm] | 1000 (continuous) |
| RF power [W] | 200 |
| RF frequency [MHz] | 13.56 |
| Apply time [sec] | 1.0 |
| Purge [sec] | 1.0 between Precursor and RF power |
| Total cycles | 100 (a thickness of 10 nm) |

After depositing a TiN film on a semiconductor substrate, a pre-cleaning step began using the reactor and then a cleaning step began using the remote plasma unit under respective conditions described blow.

Thereafter, a TiN film was deposited on a substrate again under the same conditions as those shown in Table 3. Then, the TiN film was analyzed in terms of the number of particles and the metal contamination level. Also, the interior of the reaction chamber was observed to determine whether any residue of unwanted deposits still remained. The number of particles (with a size of 0.1 μm or higher) was counted using a wafer surface inspection system using a laser. The metal contamination level was measured using a fluorescence x-ray device.

Example 1

Comparative Example

No pre-cleaning step was conducted. After the deposition, a cleaning step began under the conditions shown in FIG. 4 below.

TABLE 4

| Cleaning | |
|---|---|
| Pressure [Pa] | 1000 |
| Tem. [° C.] | 100 |
| Preprocess gas | $NF_3$ |
| Gas flow [sccm] | 1000 |
| Other gas | Ar |
| Gas flow [sccm] | 4000 |
| RF power [W] | Remote Plasma |
| Duration [min] | 30 |

Example 2

A pre-cleaning step was conducted under the conditions shown in Table 5 below, and then, a cleaning step was conducted under the same conditions as those shown in Table 4.

TABLE 5

| Pre-cleaning step | |
|---|---|
| Pressure [Pa] | 200 |
| Tem. [° C.] | 100 |
| Pre-cleaning gas | $O_2$ |
| Gas flow [sccm] | 1000 |
| Other gas | Ar |
| Gas flow [sccm] | 1000 |

TABLE 5-continued

| Pre-cleaning step | |
|---|---|
| RF power [W] | 200 |
| RF frequency | 13.56 MHz |
| Duration [min] | 3 |

Example 3

A pre-cleaning step was conducted under the same conditions as those shown in Table 5, and then, a cleaning step was conducted under the conditions shown in Table 6 below.

TABLE 6

| Cleaning | |
|---|---|
| Pressure [Pa] | 1000 |
| Tem. [° C.] | 400 |
| Preprocess gas | $NF_3$ |
| Gas flow [sccm] | 1000 |
| Other gas | Ar |
| Gas flow [sccm] | 1000 |
| RF power [W] | Remote Plasma |
| Duration [min] | 5 |

Example 4

A pre-cleaning step was conducted under the conditions shown in Table 7 below, and then, a cleaning step was conducted under the same conditions as those shown in Table 6. The pre-cleaning step was initiated after the temperature reached 400° C. (in another embodiment, it can begin when the temperature is 100° C. and while the temperature is rising).

TABLE 7

| Pre-cleaning step | |
|---|---|
| Pressure [Pa] | 200 |
| Tem. [° C.] | 400 |
| Pre-cleaning gas | $O_2$ |
| Gas flow [sccm] | 1000 |
| Other gas | Ar |
| Gas flow [sccm] | 1000 |
| RF power [W] | 200 |
| RF frequency | 13.56 MHz |
| Duration [min] | 3 |

Figure 2:
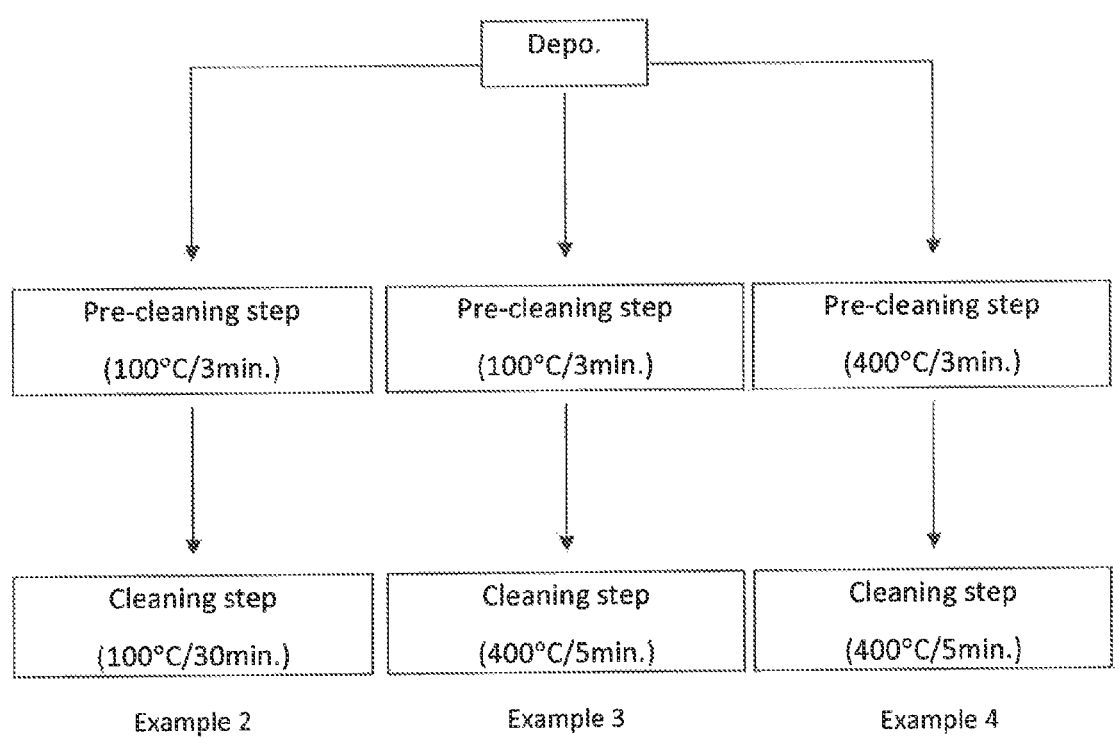
FIG. 2 is a schematic diagram illustrating processes employed according to embodiments of the present invention.

FIG. 2 is a schematic diagram summarizing the above processes employed in Examples 2-4.

The results are shown in Table 8 below,

TABLE 8

| Example | Particle added >0.1 μm(ea.) | Metal contamination level (atom/$cm^2$) | Residue in RC (Visual confirmation) |
|---|---|---|---|
| 1 | ~10000 | (Major component metal): ~$10^{13}$ | Exist |
| 2 | <1000 | (MC metal): ~$10^{11}$ | No |
| 3 | <300 | (MC metal): <$10^{11}$ | No |
| 4 | <100 | (MC metal): <$5 \times 10^{10}$ | No |

As can be seen from Table 8, when the pre-cleaning step was conducted in Examples 2-4, the number of particles having a size of 0.1 μm or greater attached to the film on the substrate was reduced to at least 1/10 of that in Example 1 wherein no pre-cleaning step was conducted, and also the metal (Ti contaminant level in the film on the substrate was reduced to at least 1/100 of that in Example 1, and further, no residue of unwanted deposits was observed in the interior of the reaction chamber. In Example 1, a residue of unwanted deposits was observed in close to gate valve areas of the interior surfaces of the reaction chamber.

When the temperature of the cleaning step was higher in Example 3 than in Example 2, the number of particles and the metal contamination level were reduced, and when the temperature of the pre-cleaning step was higher in Example 4 than in Example 3, the number of particles and the metal contamination level in Example 4 were further reduced to about 1/2 to about 1/3 of those in Example 3.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for cleaning a reaction chamber after depositing an oxide or nitride film on a substrate in a reaction chamber having interior surfaces on which oxide or nitride is accumulated as a result of the deposition, said oxide or nitride being selected from the group consisting of carbon-containing metal oxide or carbon-containing metal nitride, said method comprising the steps of:

oxidizing or nitriding the carbon-containing metal oxide or the carbon-containing metal nitride accumulated on the interior surfaces of the reaction chamber, by an RF-excited plasma of an oxygen- or nitrogen-containing gas in an absence of halide gas as a pre-cleaning step, to dissociate carbons from the carbon-containing metal oxide or the carbon-containing metal nitride; and cleaning the interior surfaces of the reaction chamber, by an RF-excited plasma of a halide cleaning gas which is a fluorine-containing gas to form metal fluoride from the carbon-dissociated metal oxide or the carbon-containing metal nitride, then removing the metal fluoride.

2. The method according to claim 1, wherein the carbon-containing metal nitride is nitrided in the pre-cleaning step by an RF-excited plasma of the nitrogen-containing gas without the oxygen-containing gas.

3. The method according to claim 1, wherein the carbon-containing metal oxide is oxidized in the pre-cleaning step by an RF-excited plasma of the oxygen-containing gas.

4. The method according to claim 1, wherein the metal is a transition metal.

5. The method according to claim 1, wherein a temperature of the pre-cleaning step is set to be the same as a temperature of the cleaning step.

6. The method according to claim 1, wherein a temperature of the pre-cleaning step is about 50° C. to about 500° C.

7. The method according to claim 1, wherein the oxygen- or nitrogen-containing gas used in the pre-cleaning step is at least one gas selected from the group consisting of $N_2$, $NH_3$, $O_2$, $O_3$, $CO_2$, and $N_2O$.

8. The method according to claim 1, wherein the pre-cleaning step is conducted for about 0.5 minutes to about 30 minutes.

9. The method according to claim 1, wherein the pre-cleaning step is conducted for a time period which is shorter than a time period during which the cleaning step is conducted.

10. The method according to claim 1, wherein the RF-excited plasma in the cleaning step is generated by a remote plasma unit and supplied to the reaction chamber.

11. The method according to claim 1, wherein the cleaning gas contains no oxygen- or nitrogen-containing gas.

12. The method according to claim 1, wherein the cleaning step is continuously conducted after the pre-cleaning step without breaking a vacuum of the reaction chamber.

13. The method according to claim 1, wherein the reaction chamber is an atomic layer deposition (ALD) chamber.

14. The method according to claim 4, wherein the transition metal is Ti.

15. The method according to claim 7, wherein the oxygen- or nitrogen-containing gas used in the pre-cleaning step further comprises $H_2$, Ar, and/or He.

* * * * *